(12) United States Patent
Feenan (10) Patent No.: US 7,372,275 B2
(45) Date of Patent: May 13, 2008

(54) GRADIENT COIL APPARATUS AND METHOD OF ASSEMBLY THEREOF

(75) Inventor: Peter John Feenan, Freeland (GB)

(73) Assignee: General Electric Company, Schenectady, NY (US)

( * ) Notice: Subject to any disclaimer, the term of this patent is extended or adjusted under 35 U.S.C. 154(b) by 78 days.

(21) Appl. No.: 11/161,853

(22) Filed: Aug. 19, 2005

(65) Prior Publication Data

US 2006/0113996 A1 Jun. 1, 2006

(30) Foreign Application Priority Data

Oct. 20, 2004 (GB) .................................. 0423322.7

(51) Int. Cl.
*G01V 3/00* (2006.01)

(52) U.S. Cl. ..................................... 324/322; 324/318

(58) Field of Classification Search ................ 324/318, 324/322

See application file for complete search history.

(56) References Cited

U.S. PATENT DOCUMENTS

| | | | | |
|---|---|---|---|---|
| 4,794,338 A | * | 12/1988 | Roemer et al. | ............. 324/319 |
| 5,111,147 A | * | 5/1992 | Aubert | ........................ 324/318 |
| 5,296,810 A | * | 3/1994 | Morich | ........................ 324/318 |
| 5,349,744 A | | 9/1994 | Takahashi | ................... 29/602.1 |
| 5,568,051 A | | 10/1996 | Yamagata | ................... 324/318 |
| 5,689,189 A | * | 11/1997 | Morich et al. | ............... 324/318 |
| 6,144,204 A | | 11/2000 | Sementchenko | |
| 6,215,307 B1 | * | 4/2001 | Sementchenko | ............ 324/318 |
| 6,320,382 B1 | | 11/2001 | Anderson | |
| 6,479,997 B1 | | 11/2002 | Westphal et al. | ............ 324/318 |
| 6,696,837 B2 | | 2/2004 | Konijn | ........................ 324/318 |
| 7,030,610 B2 | * | 4/2006 | Mansfield | ................... 324/318 |
| 2003/0155174 A1 | * | 8/2003 | Mansfield | ................... 181/207 |
| 2006/0113996 A1 | * | 6/2006 | Feenan | ....................... 324/318 |

FOREIGN PATENT DOCUMENTS

| | | |
|---|---|---|
| GB | 2265986 A | 10/1993 |
| GB | 2315555 A | 7/1997 |
| GB | 2331808 A | 11/1997 |
| JP | 57-95609 | 6/1982 |
| JP | 60-249854 | 12/1985 |
| JP | P05076507 | 3/1993 |

OTHER PUBLICATIONS

European Search Report, EP05256360.8-2209.
JP05076507, Abstract, Kataoka Takeshi, Mar. 30, 1993, Gradient Magnetic Field Coil and Production Thereof.
Great Britain Search Report. Application No. GB0423322.7. Date Searched: Mar. 8, 2005.
JP60249854. Publication date: Dec. 10, 1985. "Manfufacture of Coil Unit".
JP57095609. Publication date: Jun. 14, 1982. "Sheet Coil".

* cited by examiner

*Primary Examiner*—Brij Shrivastav
*Assistant Examiner*—Tiffany A. Fetzner
(74) *Attorney, Agent, or Firm*—Cantor Colburn LLP (57) ABSTRACT

A gradient coil assembly and a method for manufacturing the gradient coil assembly is provided. The gradient coil assembly includes an insulator sheet formed into a tube extending along an axis. The assembly further includes a first electrically conductive sheet disposed on a first surface of the insulator sheet including a first plurality of electrically conductive paths and a second electrically conductive sheet disposed on a second surface of the insulator sheet including a second plurality of electrically conductive paths. Finally, the second plurality of electrically conductive paths is electrically coupled with a corresponding path of the first plurality of electrically conductive paths.

35 Claims, 10 Drawing Sheets

X-coil — Return Paths

FIG. 2B

Y-coil — Return Paths

FIG. 2C

Z-coil

FIG. 3

PRIOR ART

GRADIENT COIL APPARATUS AND METHOD OF ASSEMBLY THEREOF

BACKGROUND OF THE INVENTION

This application claims the benefit of a priority under 35 U.S.C. 119 to Great Britain Patent Application No. GB 0423322.7 filed Oct. 20, 2004, the entire contents of which are hereby incorporated by reference.

This invention relates to a coil for a magnet and to a method of manufacturing a coil for a magnet. More particularly, it relates to a gradient coil and to a method of manufacturing a gradient coil, and in particular, to a gradient coil for use in a magnetic resonance imaging (MRI) system.

MRI systems are used today for investigating a large variety of body parts. These systems are based on nuclear phenomena displayed by atomic nuclei having a non-zero magnetic moment (or "spin"). When such nuclei are placed in a static, uniform magnetic field, the nuclear spins are aligned by the magnetic field so as to be either aligned with or against the static magnetic field. The nuclear spins are not stationary, but precess around an axis defined by the magnetic field. The frequency at which the spins precess is known as the "Larmor frequency" $\omega_0$. The Larmor frequency is given by:

$$\omega_0 = \gamma B_0$$

where $\gamma$ is the gyromagnetic ratio of the nucleus and $B_0$ is the applied magnetic field. For a hydrogen nucleus, for example, $\gamma$=42.57 MHz/T.

When the nuclear spins are aligned in the static magnetic field $B_0$, it is possible to "flip" the spins by applying an alternating magnetic field $B_1$. In order to do this, the alternating magnetic field must be at 90° to the static magnetic field and it must alternate at substantially the Larmor frequency. When such an alternating field $B_1$ is applied, the spins will tend to align themselves parallel to $B_1$, and when the alternating field is removed, the spins will relax back into the state in which they are aligned with the static magnetic field $B_0$. The alignment of the spins with the alternating field decreases the magnetization in the longitudinal direction (parallel to $B_0$) and increases the magnetization in the transverse plane (that is, the plane perpendicular to $B_0$), and the subsequent relaxation of the spins when the alternating field is removed produces the reverse effects. These changes in the magnetization are detected in the MRI process, and are processed to provide a visible display of the nuclei.

Figure 1:
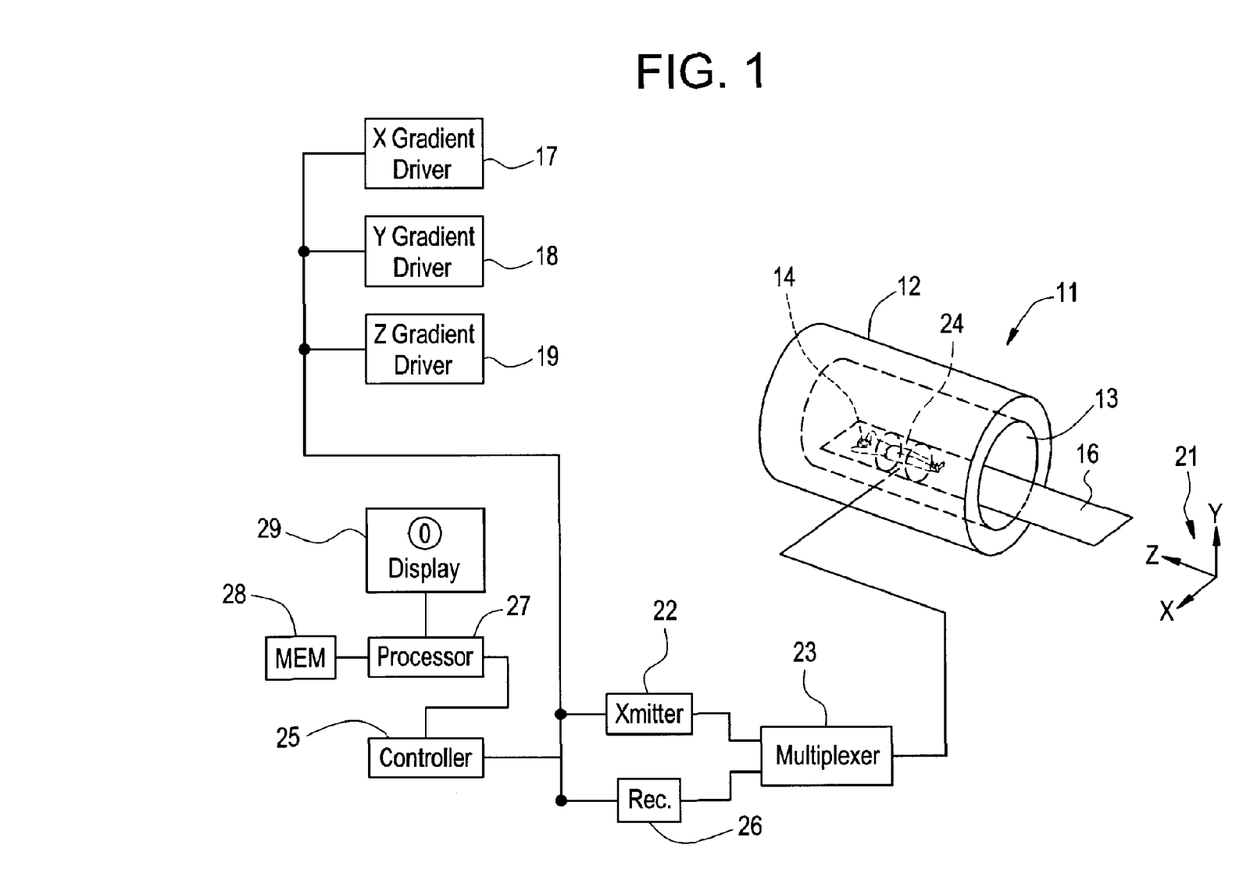
FIG. 1 is a schematic view of an MRI system.

FIG. 1 at 11 shows a typical MRI system in block diagram form. The magnet 12 provides the static magnetic field $B_0$. In principle, the magnet 12 could be a superconductive magnet, an electro-magnet or a permanent magnet. However, a super-conducting magnet is commonly used, since these readily provide a large, homogeneous static magnetic field. The magnet 12 contains a bore 13 enabling the entry of a patient into the static magnetic field. A patient shown at 14 is inserted into the bore 13 using a bed arrangement 16 so as to be within the static magnetic field.

Radio frequency (rf) pulses generated by transmitter 22 and applied through multiplexer 23 and radio frequency coil apparatus 24 act to tip the aligned spins so as to have a projection, for example, in the X-Z plane; the X-Y plane or the Y-Z plane. The X, Y, and Z nomenclature refers to the imaginary orthogonal axes shown at 21 used in describing MRI systems; where the Z axis is an axis co-axial with the axis of the bore hole. The Y axis is the vertical axis extending from the center of the magnetic field and the X axis is the corresponding horizontal axis orthogonal to the other axes.

The spins when realigning after the radio frequency pulse is removed generate free induction decay (FID) signals which are received by the radio frequency coil apparatus 24 and transmitted through the multiplexer 23 to the receiving circuit 26. From the receiving circuit the received signals go through the controller 25 to an image processor 27. The image processor works in conjunction with a display memory 28 to provide the image displayed on display monitor 29. It should be noted that the radio frequency coil apparatus 24 can comprise separate coils for transmitting and receiving or the same coil apparatus 24 could be used for both transmitting and receiving the rf pulses.

In order to spatially resolve the MRI signal, encoding signals within the static magnetic field are provided by gradient coils (not shown in FIG. 1). There are typically three sets of gradient coils. X gradient coils alter the strength of the Z component of the static magnetic field along the X axis, Y gradient coils alter the strength of the Z component of the static magnetic field along the Y axis, and Z gradient coils alter the strength of the Z component of the static magnetic field along the Z axis. The strength of the Z component of the static magnetic field in other directions, than the X and Z axes for example, can be changed using two or three of the gradient coils in combination.

The X, Y and Z gradient coils are driven by X gradient driver 17, Y gradient driver 18 and Z gradient driver 19, respectively. It is possible to modify the local static magnetic field $B_0$, at a particular point in space using the gradient coils so that only nuclei within a small volume element of the patient have a Larmor frequency equal to the frequency of the rf field $B_1$. This means that the F.D.I. signal comes only from nuclei within that volume element of the patient. In practice the gradient coils are supplied with time-varying electrical currents from a power supply, such as a power amplifier, so that the volume element in which the nuclei have a Larmor frequency equal to the frequency of the applied rf field scanned over the patient so as to build up a 2-D or 3-D image of the patient.

Figure 2A:
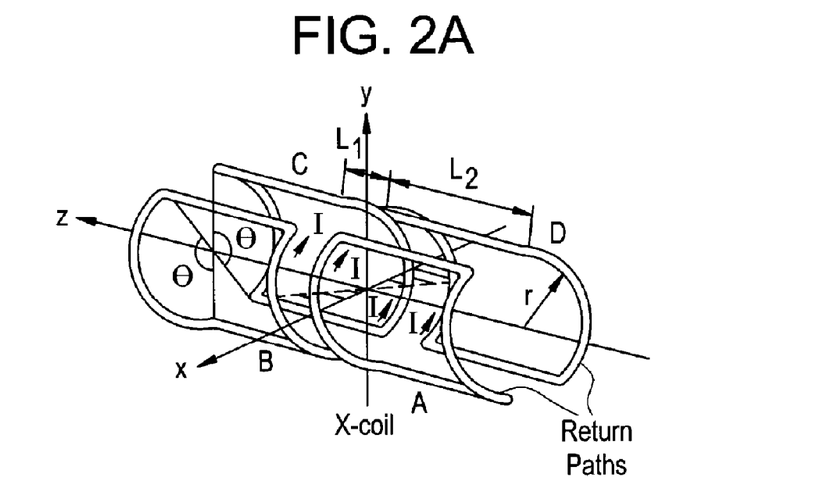
Figure 2B:
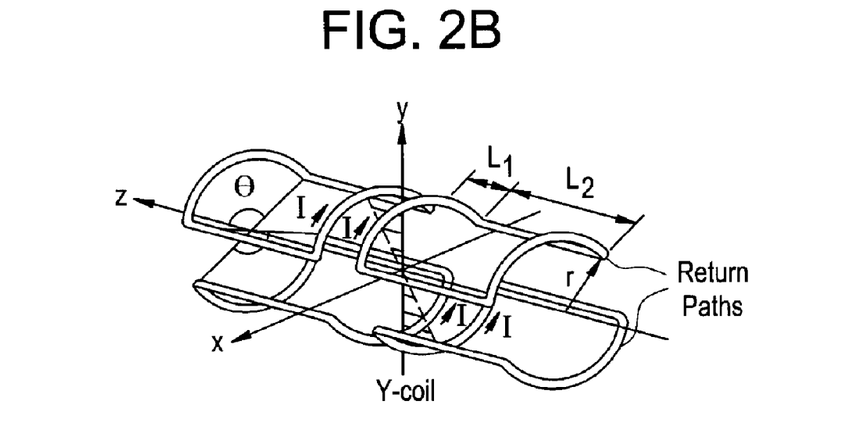
Figure 2C:
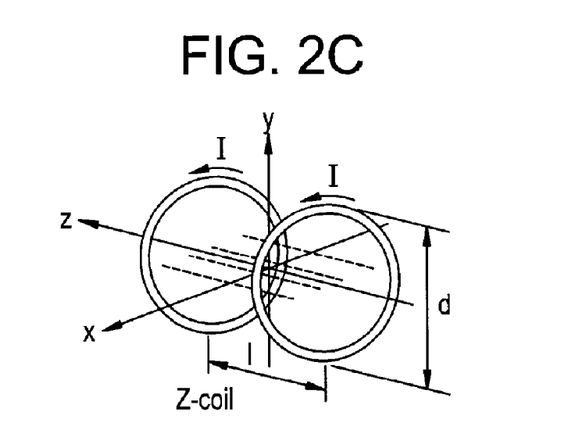

A typical prior art set of gradient coils is disclosed in, for example, "Foundations of Medical Imaging" by Z. H. Cho et al. (published by Wiley International), and is shown schematically in FIG. 2. The X gradient coils are shown in FIG. 2(a). FIGS. 2(b) and 2(c) show the Y gradient coils and the Z gradient coils, respectively.

It is common practice to provide an actively screened gradient coil, which comprises an inner cylindrical assembly, and an outer assembly disposed coaxially and concentrically with respect to the inner. The outer assembly is connected in series opposition to the inner assembly and the composite design is chosen to reduce the external field produced by the whole, which would create unwanted eddy-current effects in the structure of the magnet. Typically there will be fewer turns on the outer assembly than on the inner assembly.

It will be noted that the X gradient coils and the Y gradient coils shown in FIGS. 2(a) and 2(b) are in the form of saddle coils. In each case, two saddle coils are placed on either side of the X-Y plane.

In the prior art, the gradient coils are constructed over a tubular base. In one possible arrangement, the X gradient coils are disposed over the tubular base, the Z gradient coils are placed over the X gradient coils, and finally the Y gradient coils are placed over the Z gradient coils (although the order in which the gradient coils are provided on the former is not limited to this particular order).

An X gradient field may be generated by utilizing a set of at least four X gradient coils A, B, C, D with appropriate current senses laid on a first cylinder. (See FIG. 3 of the accompanying drawings). The four gradient coils may be termed saddle coils, as discussed above. They have one or more planes of symmetry (three in the case of an X or Y gradient coil). The four gradient coils (saddles) may be connected in series. A Y gradient coil resembles an X gradient coil, rotated through 90° about the Z axis. X and Y gradient coils may be manufactured by cutting or etching a complex track in a sheet of electrically conductive material. To minimize heat dissipation, it is desirable to leave as much conductive material in the sheet as possible, resulting in a pattern having conductive tracks of variable widths.

Figure 3:
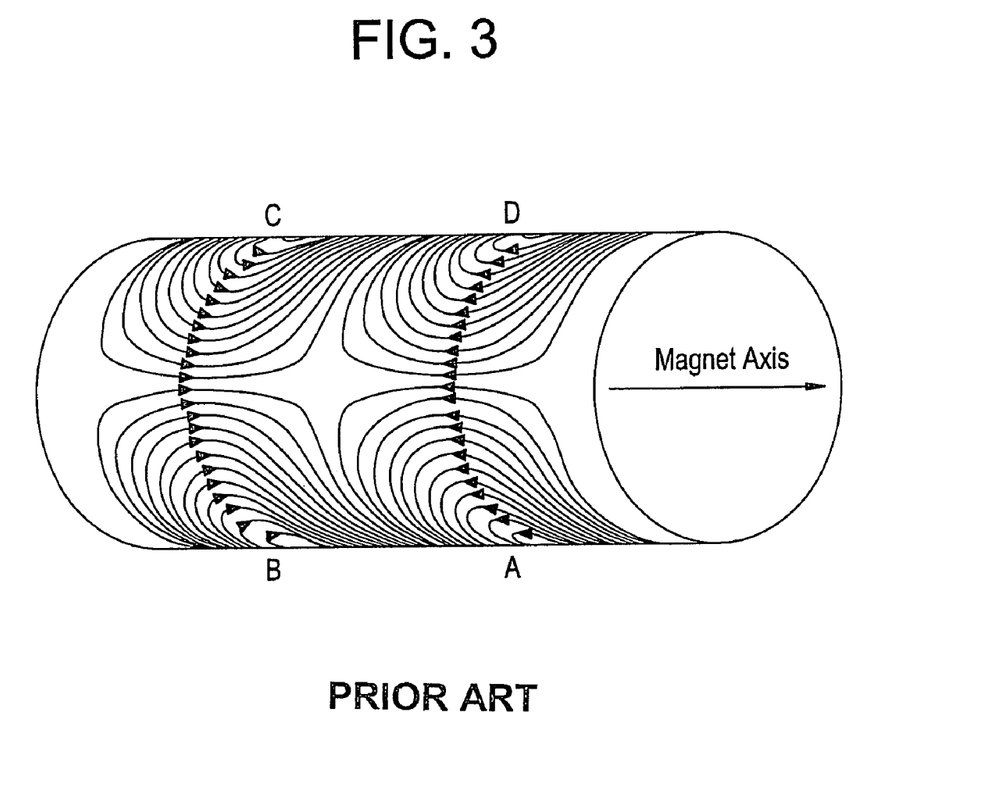
FIG. 3 shows a conventional X or Y gradient coil, with relative current sense.
Figures 4, 5:
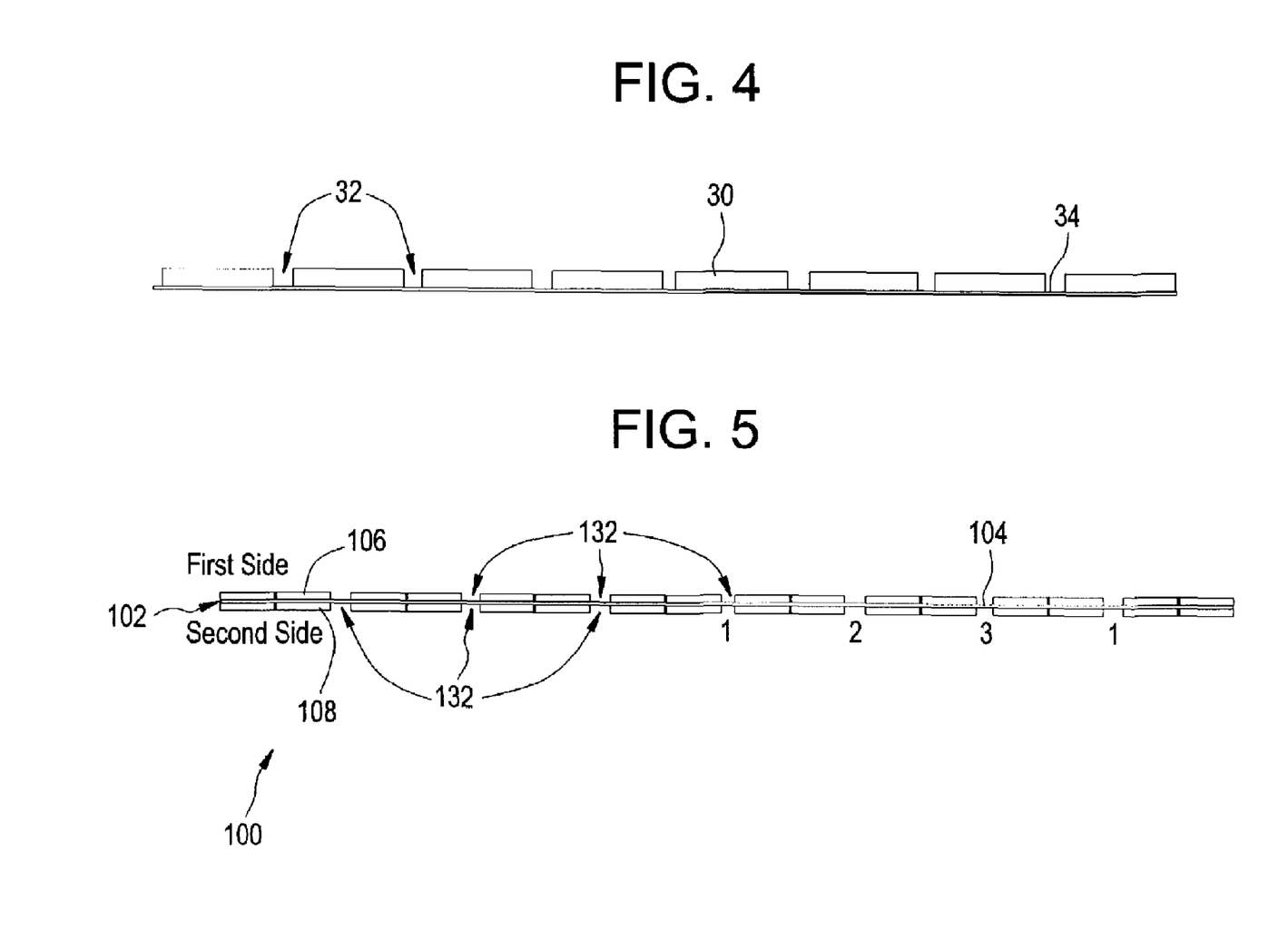
FIG. 4 is a cross section view through one quadrant of a traditional X or Y gradient coil of FIG. 3 illustrating a single layer copper plate being disposed on an insulating tube.
FIG. 5 is a cross section view through one quadrant of an X or Y gradient coil illustrating a double layer copper plate with an insulating sheet disposed between layers in accordance with an exemplary embodiment.

The X and Y gradients currently available are made from a flat copper plate 30 (typically 2 mm in thickness as depicted in FIG. 4) with a single 'spiral' cut or track 32 in the copper plate 30 to form the electrical circuit. Four such plates are arranged as quadrants (e.g., A, B, C, D) on the surface of a cylindrical form 34 to create the whole 'X' gradient, for example, as shown in FIG. 3. The resultant tracks 32 are wide and relatively small in number in order to match the available power supplies. This results in several undesirable affects. The small number of turns results in quantization effects in which the design can vary only by single full turns. However, the relative difference between N and N+1 turns can be quite large where N is small. The linearity, screening or strength, therefore, cannot all be matched simultaneously to be within a certain accuracy. An additional disadvantage is that the connection between each of the quadrants requires an additional connecting conductor which is disposed on either a top or a bottom of the copper plate, which takes up valuable build space. A third disadvantage is that the wide tracks result in an uncertain current path during rapid pulsing. In particular, eddy-current effects cause the current to run at the extremities of the tracks that in effect manifests as a non-constant resistance versus frequency of an applied ac current. The resulting image has time-dependent distortions that must be corrected.

In some gradient assemblies of prior art, attempts have been made to drive different parts of the circuit with separate power supplies. For example, coils A and D of FIG. 2a are driven by one power supply and coils B and C are driven by a second power supply, or alternatively, coils A and B are driven by one power supply while coils C and D are driven by another. Thus, each power supply need only provide a smaller output power to achieve the same gradient strength, and/or the gradient can be drive more rapidly for the same peak voltage. Therefore, the power supplies will be smaller, less expensive and more reliable. One serious disadvantage of this arrangement is that in order for the gradient field to be accurately linear, as required by in imaging equipment, it is necessary that the current from each is accurately identical at all times during the pulse sequence. This results in unachievable requirements for maintaining accurately identical currents with identical phase at all times from the power-supply/gradient combination and such attempts have largely been abandoned.

BRIEF DESCRIPTION OF THE INVENTION

The foregoing problems and disadvantages are overcome by a gradient coil assembly and method for manufacturing assembly in accordance with the exemplary embodiments disclosed herein.

A gradient coil assembly in accordance with exemplary embodiments includes an insulator sheet formed into a tube extending along an axis. The assembly further includes a first electrically conductive sheet disposed on a first surface of the insulator sheet including a first plurality of electrically conductive paths and a second electrically conductive sheet disposed on a second surface of the insulator sheet including a second plurality of electrically conductive paths. Finally, the second plurality of electrically conductive paths is electrically coupled with a corresponding path of the first plurality of electrically conductive paths, the second plurality of electrically conductive paths need not have the same number of turns as the first plurality of electrically conducting paths.

A gradient coil assembly in accordance with another exemplary embodiment includes an insulator sheet formed into a tube extending along an axis; a first electrically conductive sheet bonded to a first surface of the insulator sheet including a first plurality of electrically conductive paths; and a second electrically conductive sheet bonded to a second surface of the insulator sheet including a second plurality of electrically conductive paths, wherein the second plurality of electrically conductive paths is electrically coupled with a corresponding path of the first plurality of electrically conductive paths, wherein the first and second electrically conductive paths are defined by first ends and opposite second ends, the first ends of each of the first electrically conductive paths mating with respective first ends of the second electrically conductive paths through the insulator sheet, the seconds ends of each being operably coupled to one of a power source and another gradient coil assembly.

A method for assembling a gradient coil assembly for use in an MRI device in accordance with exemplary embodiments is provided. The method includes disposing a first electrically conductive sheet generally concentrically about a second electrically conductive sheet with an insulator sheet therebetween; forming a first plurality of electrically conductive paths on the first electrically conductive sheet; forming a second plurality of electrically conductive paths on the second electrically conductive sheet; and electrically coupling the second plurality of electrically conductive paths with a corresponding path of the first plurality of electrically conductive paths.

Other systems and/or methods according to the embodiments will be or become apparent to one with skill in the art upon review of the following drawings and detailed description. It is intended that at all such additional systems, methods, and/or computer program products be within the scope of the present invention, and be protected by the accompanying claims.

BRIEF DESCRIPTION OF THE DRAWINGS

FIGS. 2(*a*), 2(*b*), and 2(*c*) are schematic views of a conventional set of X, Y and Z gradient coils, respectively;

DETAILED DESCRIPTION OF THE INVENTION

Referring to the drawings, identical reference numerals represent identical components in the various views. Referring to FIG. 5, a cross section view of a saddle coil 100 of one quadrant of an 'X' or 'Y' type gradient coil is illustrated in accordance with an exemplary embodiment. The saddle coil assembly 100 is defined by a double layer electrically conductive sheet or plate 102 sandwiching an insulating sheet 104. In particular, each plate 106 and 108 includes insulating sheet 104 therebetween comprising one quadrant (e.g., A, B, C, or D) of the gradient coil. In an exemplary embodiment, coil assembly 100 is a sandwich construction having two thin copper plates 106 and 108 each having a thickness of about 1 mm, however, other electrically conductive materials are contemplated other than copper. The thin copper plates 106 and 108 are bonded to the insulator 104 to form a 'double-sided' copper plate 102. Spiral cuts 132 are made in both sides (sides A and B) of assembly 100 leaving a track in each copper plate 106 and 108. The cuts 132 are arranged such that multiple parallel tracks (e.g., 1, 2, 3) are formed as best seen with reference to FIGS. 6 and 7. Although three tracks are illustrated, two or more parallel tracks can be formed.

In one example, the present disclosure provides individual saddles constructed from two electrically conductive sheets, but with each sheet having multiple inter-wound spirals, rather than a single spiral. The spirals are not, in general, regular or identical. The distinguishable spirals or tracks on a first side and a second side of saddle A (FIGS. 6 and 7) are T11, T12, T13 and T21, T22, T23, respectively.

Figure 6:
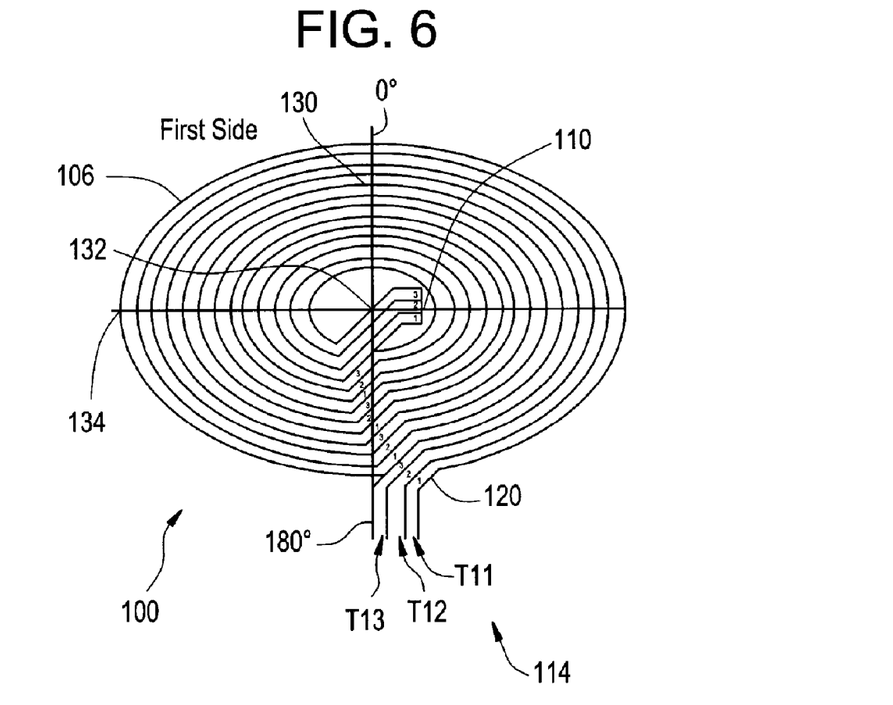
FIG. 6 is a top plan view of the double-sided plate of FIG. 5 illustrating a three track configuration of side A in accordance with an exemplary embodiment.
Figure 7:
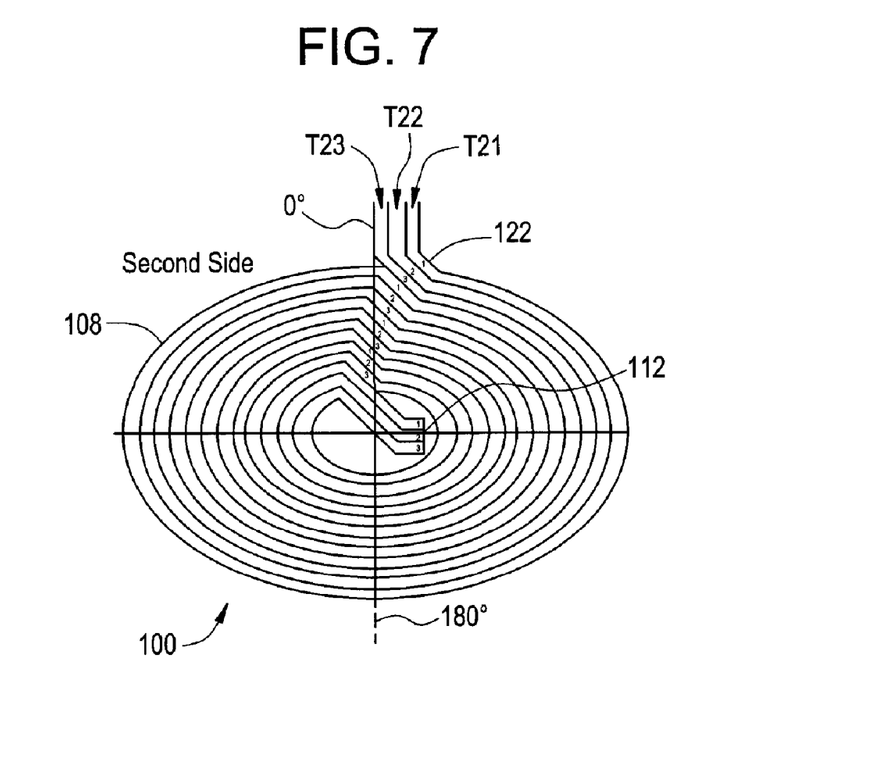
FIG. 7 is a bottom plan view of the double-sided plate of FIG. 5 illustrating a three track configuration of side B opposite side A in accordance with an exemplary embodiment.

Referring now to FIGS. 5, 6 and 7, the tracks T11, T12, T13 on the first side extend to a first central region 110 of plate 106 and extend through the insulator 104 to a second central region 112 of plate 108 and join with the tracks T23, T22, T21 on the second side. The direction of the spiral on each side of plates 106 and 108 is such that current passing from an end at the edge of the first side at 14, travels inward around the spiral on the first side (FIG. 6), producing a gradient field, and then travels outward around the spiral on the second side (FIG. 7) producing a gradient field which adds to the gradient field produced by the current path on the first side.

Where the tracks are joined from the first side at a first central region 110 to the second side at a second central region 12 and aligned therewith, tracks T11, T12, T13 are transposed with tracks T21, T22, T23. More specifically, a track, which is a radially outward track on the first side (e.g., T11), will be joined to a track that is a radially inward track on second side Y (e.g., T23). In this manner, each track appears electrically identical and equal current sharing is achieved.

Referring to FIGS. 6 and 7, the start of each track on the first side (T11, T12, T13) initiates at a particular radial position from a first edge 120 edge defining plate 106, for example, at a 180 degree radial position as illustrated in FIG. 6. As each track (T11, T12, T13) joins with a respective track (T23, T22, T21) on the second side at the center regions 110, 112, each track (T21, T22, T23) spirals outward terminating at a different radial position than that for the first side, e.g., terminates at a zero degree radial position proximate a second edge 122 defining plate 108 as illustrated in FIG. 7. Because the joint between tracks T11, T12, T13, T21, T22, T23 occurs at central regions 110, 112 corresponding to plates 106, 108, respectively, no lost turns or part turns are created.

Still referring to FIGS. 6 and 7, it will be recognized by one skilled in the pertinent art that both plates 106 and 108 have an identical spiral configuration. More specifically, if plate 106 is rotated 180 degrees about an axis 130 defining the zero and 180 degree radial positions described above and then rotated 180 degrees about a center 133 defining a center of plate 106 or about central portion 110, a spiral configuration of plate 108 in FIG. 7 results. Likewise, if plate 106 is merely rotated 180 degrees about an axis 134 transverse to axis 130, the spiral configuration of plate 108 illustrated in FIG. 7 results. Therefore, an identical spiral configuration on both the first and second sides facilitates manufacture of a double-sided plate configuration.

Figure 8:
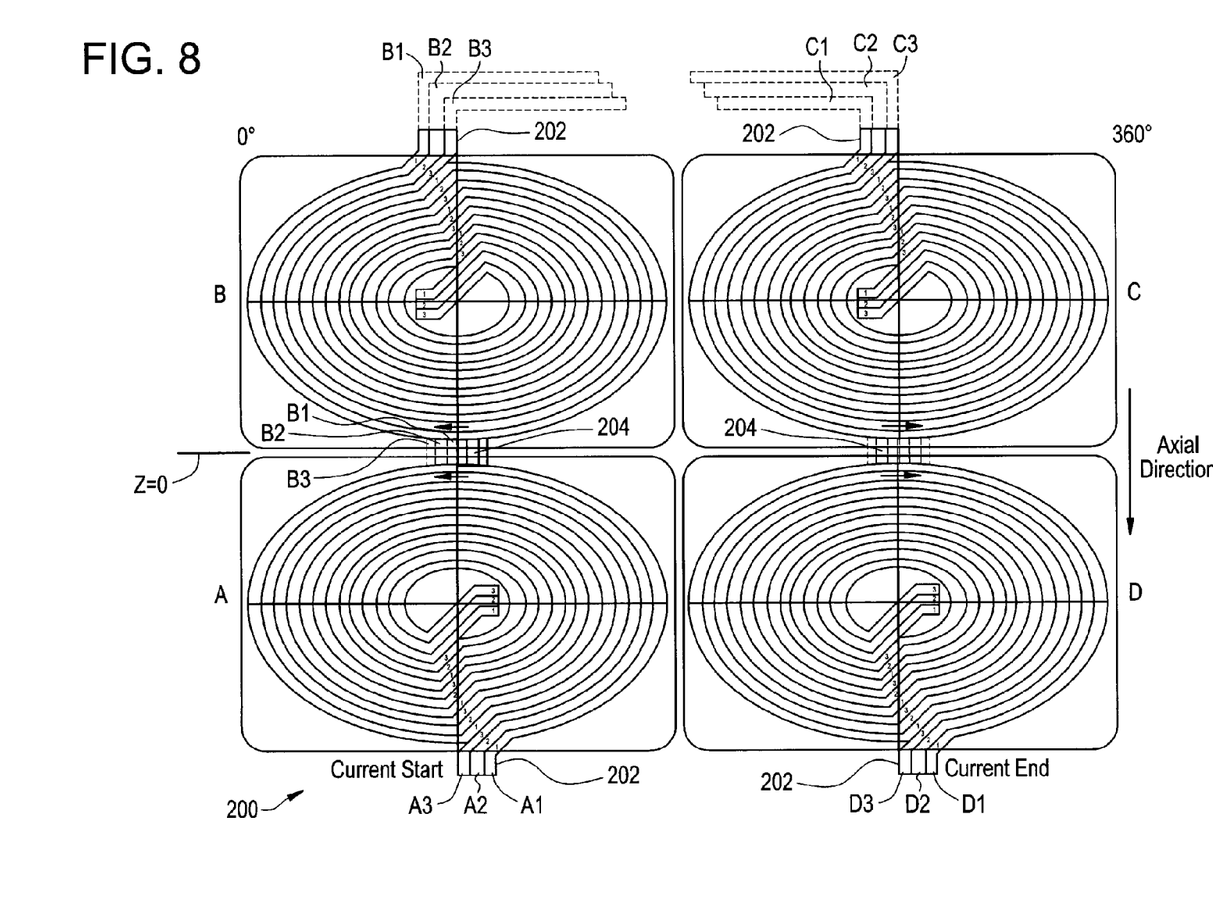
FIG. 8 is schematic layout of a first side plate of a double side plate configuration of four quadrants of an X gradient coil each having the double side plate configuration of FIGS. 6 and 7 illustrating interconnection between quadrants in accordance with an exemplary embodiment.

When the saddles A, B, C, D on a former (i.e., insulator 104) are interconnected, the individual spirals are kept separate, and a number of electrically distinct composite circuits are formed. Referring now to FIG. 8, four quadrant saddle coils A, B, C, D are illustrated at 200 including saddle coil A illustrated in FIGS. 6 and 7. Each saddle coil A, B, C, and D includes ends 202 for each of the tracks 1, 2, and 3 for any quadrant appearing at the edge defining each double-sided plate 100. Joints between the A and B quadrants and C and D quadrants are easily created by overlapping tabs 204, where one tab is from one quadrant is from an upper layer or first plate 106 and the mating tab is from the lower layer or second plate 108 of the mating quadrant.

FIG. 8 shows this example in "unwrapped" form. Each resultant composite circuit contains a spiral of each type; for example, if there are four saddles, A, B, C, and D (i.e. four sub-units), each containing two layers with three respective spirals on each layer, 1, 2, and 3 corresponding to three individual tracks (FIG. 5), i.e. three non-identical, distinguishable electrically conductive paths or tracks, then the three composite circuits might be:

$$(A1_{Upper}+A3_{Lower}+B1_{Upper}+B3_{Lower}+C1_{Upper}+C3_{Lower}+D1_{Upper}+D3_{Lower})$$

$$(A2_{Upper}+A2_{Lower}+B2_{Upper}+B2_{Lower}+C2_{Upper}+C2_{Lower}+D2_{Upper}+D2_{Lower})$$

$$(A3_{Upper}+A1_{Lower}+B3_{Upper}+B1_{Lower}+C3_{Upper}+ \\ C1_{Lower}+D3_{Upper}+D1_{Lower})$$

Figure 9A:
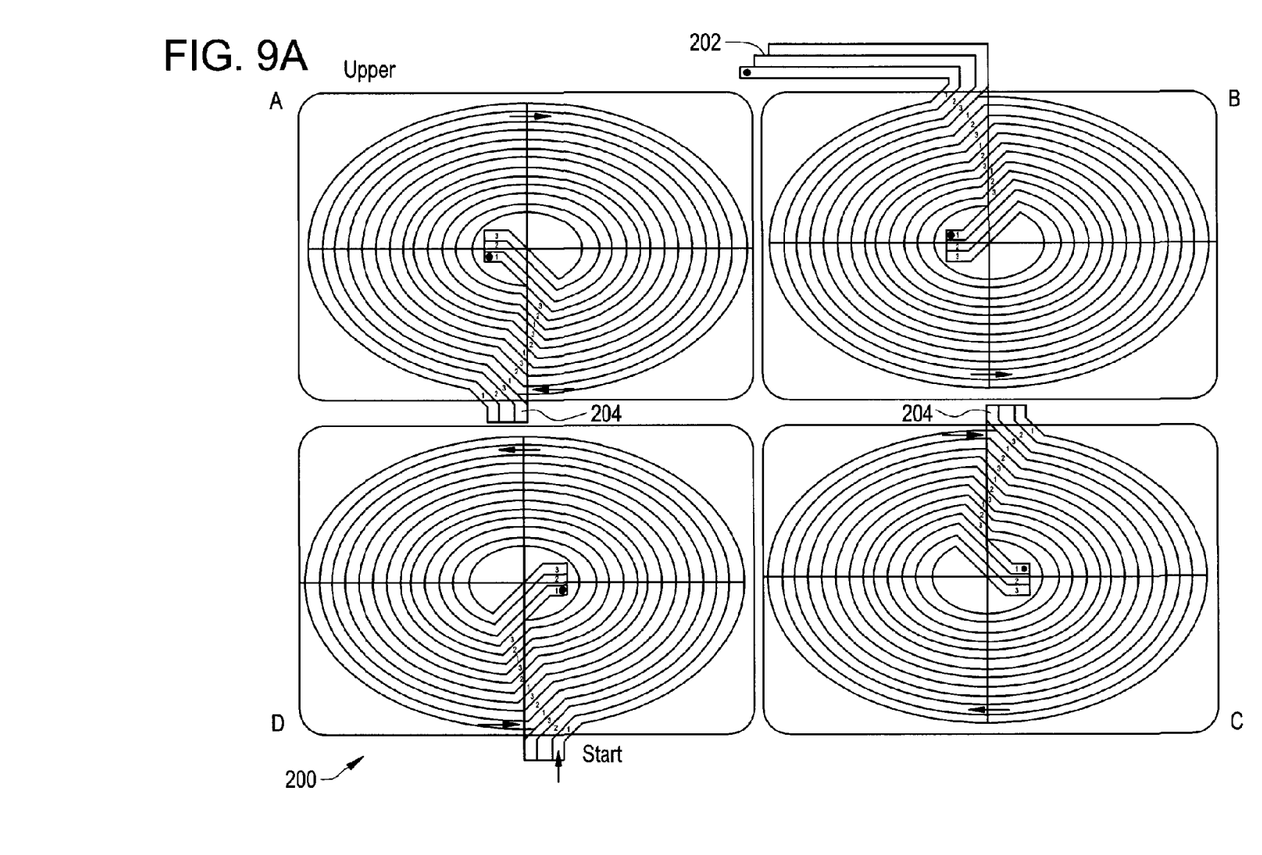
FIG. 9A is schematic layout of a first side plate of a double side plate configuration of four quadrants of an X gradient coil as in FIGS. 6 and 7 illustrating a current start path for each track in accordance with an exemplary embodiment.
Figure 9B:
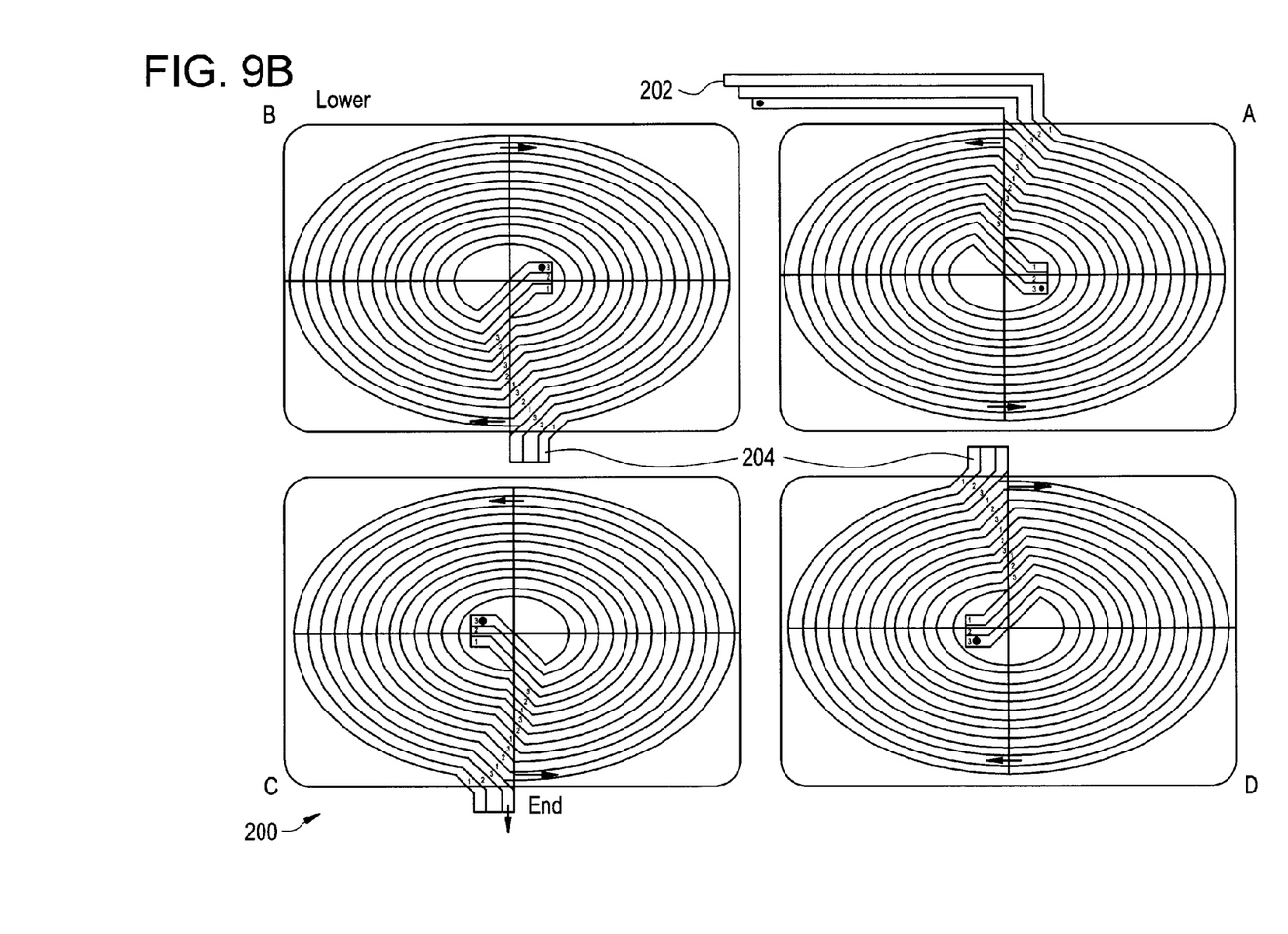
FIG. 9B is schematic layout of an second side plate or lower layer of the double side plate configuration opposite the first side plate of FIG. 9A illustrating a current end path for each track.

FIGS. 9A and 9B are enlarged top and bottom plan views respectively of another embodiment of a double sided copper plate having spiral tracks similar to those shown in FIG. 8. FIGS. 9A and 9B also illustrate each side in "unwrapped" form and are illustrated to most clearly depict connection from quadrant-to-quadrant and from side-to-side. For example, if FIGS. 9A and 9B are placed back to back aligning corners A and C of FIG. 9A with corresponding corners A and C on FIG. 9B, current paths for each of one of the composite tracks (three shown) may be depicted. The current path for each composite track (e.g., 1, 2, 3) starts at the lower left of FIG. 9A and travels inward to a center of saddle D. The current then transposes at a center thereof (e.g., black dot) to a gradient coil disposed below in FIG. 9B (saddle D of FIG. 9B). The current then passes from one quadrant to the other via the tabs 202, 204 and also transposes from inner to outer or outer to inner track at these joint interfaces.

In particular, when the current travels from a left hand pair of quadrants, as illustrated, to a right hand pair of quadrants, or vice versa, the current also transposes. This results in the interconnect or tabs 202 disposed at the top right of FIG. 9A are connected directly through the insulating layer to corresponding tabs 202 illustrated in FIG. 9B. In this manner, the horizontal tracks (1, 2, 3) on the upper layer meet the horizontal tracks (3, 2, 1), respectively on the lower layer as illustrated in FIGS. 9A and 9B). More specifically, the black dot depicted at tab 202 on track 1 of FIG. 9A is in electrical communication with the black dot depicted at tab 202 on track 3 of FIG. 9B. Finally, the current exits from the lower layer at quadrant C depicted in FIG. 9B.

Figure 10:
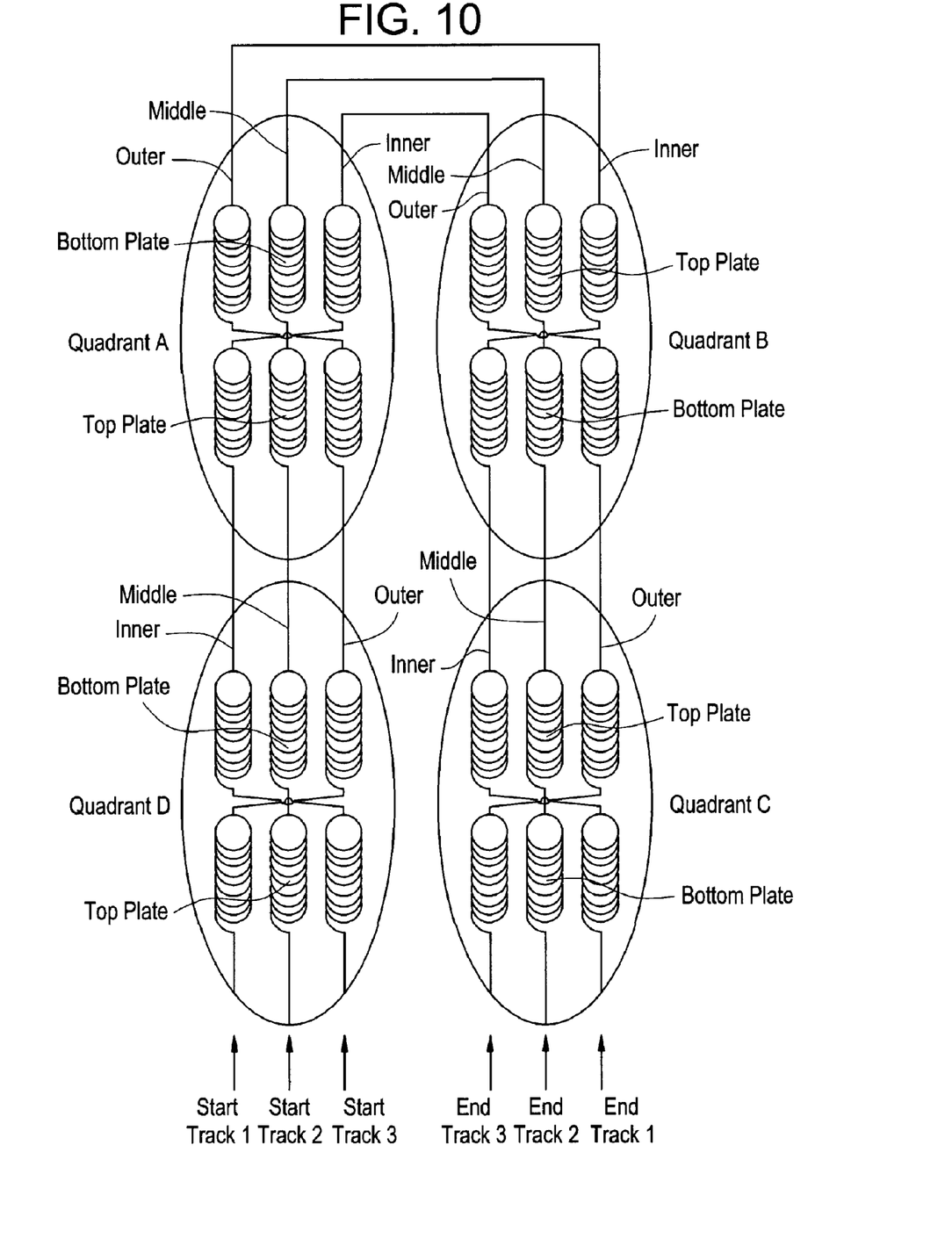
FIG. 10 illustrates circuitry corresponding to FIG. 8.
Figure 11:
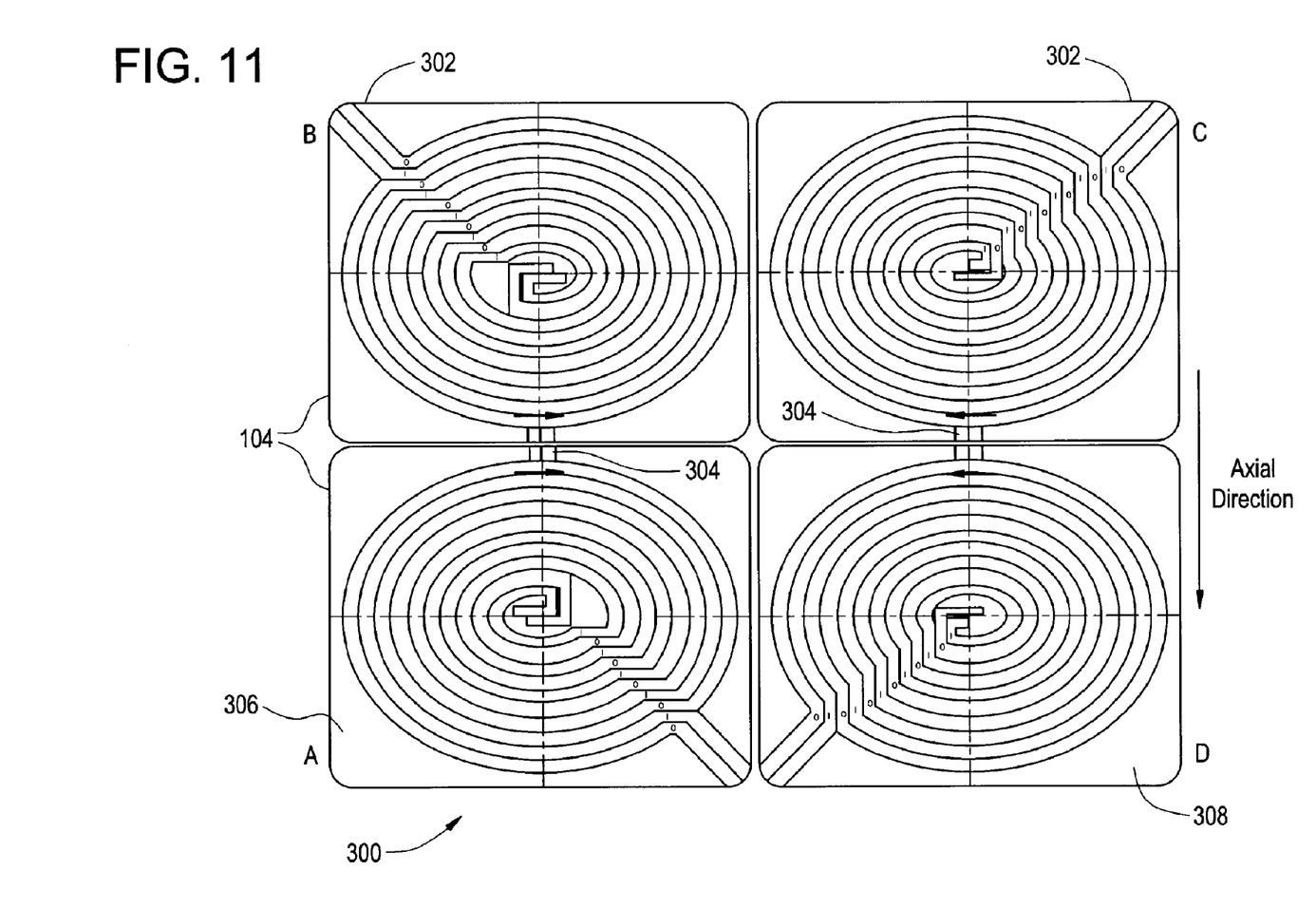
FIG. 11 is a schematic layout of four quadrants of an X gradient coil each having the double side plate configuration similar to FIGS. 6 and 7 illustrating interconnection between quadrants in accordance with an alternative exemplary embodiment.

A schematic representation of one interconnection scheme is shown in FIG. 10. Many different permutation schemes are possible. For the case above with three tracks (i.e., 1, 2, 3), there are 6 distinguishable schemes. However the scheme shown above is the only scheme where no track needs to cross over another track in order to make the connection, and each resultant composite circuit is electrically identical to the others. The case shown in FIG. 10 is easy to implement. The composite circuits may be kept separate, or linked at no more than one point, and may be driven by independent electrical supplies. The various composite circuits may be connected in parallel at both ends, but not elsewhere, making a single electrical entity or sub-entity, in which rapidly varying current is shared equally between the various composite circuits. The different composite circuits can be driven in parallel by separate power supplies. The exemplary embodiments described herein do not suffer from the disadvantage described earlier, in that each of the circuits provides a linear gradient field, and therefore, small differences in current between one circuit and another will not manifest itself as a non-linearity in the composite gradient field produced.

When a magnetic gradient is switched on or off, one preference is to avoid an uneven current distribution in the different composite circuits. Such an uneven distribution can be resolved into a set of equal external currents, plus combinations of internal circulating currents. When the magnetic gradient is switched on or off, the present invention preferably reduces the effects of net electromotive force (EMF) thus, reducing induction of such internal circulating currents.

With respect to wide copper tracks, a primary issue is that the effect of the rate of change of field in the region of the track forces the current to flow unevenly across the width of the track. Thus, the current does not use the full cross-section of conductor and an apparent resistance is increased. The effect becomes stronger at higher frequencies and is known as 'ac resistance'. Accordingly, exemplary embodiments use relatively narrow tracks compared to the prior art wide tracks. Furthermore, the larger effective number of turns using narrower tracks allows more flexibility in design reducing the quantization affects.

Taken over the entire structure, the composite circuits are electrically and magnetically equivalent. Current will exhibit no preference for one path over another, and at high frequencies more conductor will be active in carrying current, and the losses encountered will be less than in a conventional gradient design.

An equivalent interconnection scheme may be implemented with wire, rather than sheet, e.g., multiple, interwound circuits of electrically insulated wire, including Litz wire. A single gradient axis winding may incorporate one or more such gradient windings connected in series, to constitute a whole gradient winding. Other variations are possible. In some cases a twofold spiral implementation in which the sub-entity constitutes two saddles may be adequate.

The exact shape of the spiral is determined by software to produce the required gradient linearity and the number of turns is determined to provide the required gradient strength and current/voltage to match the power supply.

Insulator sheet or tube 104 disposed between electrically conductive sheets 106 and 108 may be constructed from a fiber composite material comprising one or more layers wherein each layer comprises a plurality of fibers such as glass fibers, carbon fibers, Kevlar fibers, and aluminum oxide fibers, for example, coated with an epoxy resin. Tube 104 may further include saddle coils A, B, C, D constructed from two copper sheets that are disposed on both exterior surfaces defining tube 104. Saddle coils A, B, C, D are provided to generate a magnetic field and are electrically coupled together. Saddle coils A, B, C, D may be adhesively applied to tube 104 with adhesives such as epoxy resin for example. As shown in FIGS. 2 and 3, saddle coils A, B, C, D are disposed about a Z-axis.

Referring now to FIG. 10, an alternative embodiment of the four quadrant saddle coils A, B, C, D of FIG. 8 are illustrated at 300 depicting interconnects between the quadrants. FIG. 10 illustrates each coil having a pair of tracks (0, 1). Interconnection between coils A and B and between C and D, is as described with respect to FIG. 8 (e.g., tabs 304 shown in phantom). Further, connection between first and second plates 106 and 108 of any coil is in a central portion as described with reference to FIGS. 6-8. The proximity of the exit points 302 of the tracks (0,1) allows simple connection from one coil to another in this embodiment. More specifically, saddle coil B and C are connected using tabs (e.g., male and female (not shown)) built into each plate. When insulator sheet 104 is folded, exit points 302 from each coil B and C meet to facilitate connection therebetween. However, it will be recognized that in this alternative embodiment, two types or configurations of plates 306 and 308 are required. Coils A and B depict a left hand configuration, while coils C and D reflect a right hand configuration. The left hand configuration corresponds with exit point 302 extending from a left hand edge defining coil B, while the right hand configuration corresponds with exit point 302 extending from a right hand edge defining coil C. More specifically, when coil A is rotated 180 degrees about its center, the configuration of coil B results. Likewise, when coil D is rotated 180 degrees about its center, the configuration of coil C results. Therefore, although this alternative embodiment provides proximity of exit points 302 for connection therebetween, two different configurations of plates are required.

The inventive gradient coil assembly and method for manufacturing the assembly provide substantial advantages over other assemblies and methods. In particular, the inventive gradient coil assembly allows a narrow width for each track resulting in a more defined current path as compared to other gradient coil assemblies. In particular, the multiple parallel tracks result in a larger number of turns which affords the designer a greater ability to fine-tune the magnetic characteristics of the coil as compared to other assemblies which a smaller number of turns and wider tracks. In addition, a better match between amplifier and gradient is possible by the above disclosed apparatus and method for the inventive gradient coil assembly. Still further, the inventive gradient coil assembly includes joints or interconnections between quadrants that are at an edge of each plate and are easily made without a need for extra connecting wire which takes up build depth. A further advantage is that the invention facilitates the ability to drive parallel tracks with separate power supplies including a much reduced need for accurate matching of currents between circuits. Still further, the inventive configuration of coils described herein can equally be applied to both inner and outer assemblies.

While the invention is described with reference to exemplary embodiments, it will be understood by those skilled in the art that various changes may be made an equivalence may be substituted for elements thereof without departing from the scope of the invention. In addition, many modifications may be made to the teachings of the invention to adapt to a particular situation without departing from the scope thereof. Therefore, is intended that the invention not be limited the embodiments disclosed for carrying out this invention, but that the invention includes all embodiments falling with the scope of the intended claims. Moreover, the use of the term's first, second, etc. does not denote any order of importance, but rather the term's first, second, etc. are us are used to distinguish one element from another.

What is claimed is:

1. A gradient coil assembly configured for use in an MRI device, comprising:
   an insulator sheet formed into a tube extending along an axis;
   a first electrically conductive sheet disposed on a first surface of the insulator sheet including a first plurality of electrically conductive paths, each of the first plurality of electrically conductive paths initiating at a first common region and terminating at a second common region on the first electrically conductive sheet, the second common region being distant from the first common region; and
   a second electrically conductive sheet disposed on a second surface of the insulator sheet including a second plurality of electrically conductive paths, wherein each of the second plurality of electrically conductive paths is electrically coupled with a corresponding one of the first plurality of electrically conductive paths;
   wherein the first plurality of electrically conductive paths and the second plurality of electrically conductive paths are defined by first ends and opposite second ends, the first ends of each of the first plurality of electrically conductive paths mating with respective first ends of the second plurality of electrically conductive paths through the insulator sheet, the second ends of each being operably coupled to one of a power source and another gradient coil assembly.

2. The gradient coil assembly of claim 1, wherein the second plurality of electrically conductive paths are disposed generally concentrically relative to the first plurality of electrically conductive paths.

3. The gradient coil assembly of claim 1, wherein the first and second electrically conductive sheets are bonded to respective first and second surfaces of the insulator sheet with an adhesive.

4. The gradient coil assembly of claim 1, wherein each of the second plurality of electrically conductive paths initiate at a first common region and terminate at a second common region on the second electrically conductive sheet.

5. The gradient coil assembly of claim 1, wherein the first ends mate in a central portion defining each of the first and second electrically conductive sheets.

6. The gradient coil assembly of claim 1, wherein the first ends of the first electrically conductive paths are transposed when mating with respective first ends of the second electrically conductive paths.

7. The gradient coil assembly of claim 1, wherein the first and second electrically conductive sheets are each copper plates having first and second plurality of conductive paths being spiral cuts in each respective copper plate.

8. The gradient coil assembly of claim 7, wherein the spiral cuts are defined by the first and second ends, the first ends having mating tabs for electrical connection between the copper plates.

9. The gradient coil assembly of claim 7, wherein each of the copper plates each include a thickness of about 1 mm.

10. The gradient coil assembly of claim 7, wherein a direction of the spiral cuts on each copper plate allows an electrical current to spiral inward from an edge defining one copper plate producing a first gradient field, through the insulator sheet, and spiral outward on the other copper plate producing a second gradient field which adds to the first gradient field on the one copper plate.

11. The gradient coil assembly of claim 7, wherein each of the first and second plurality of electrically conductive paths is substantially electrically equal achieving equal current sharing therebetween.

12. The gradient coil assembly of claim 11, wherein a configuration of the spiral cuts is determined by software configured to determine a number of turns to provide a suitable gradient strength, gradient linearity and current and voltage match relative to a given power supply.

13. The gradient coil assembly of claim 7, wherein the spiral cuts on each plate are identical.

14. The gradient coil assembly of claim 1, wherein the first surface and the second surface of the insulator sheet are disposed on the same insulator sheet, the first surface disposed at a first radial distance from a central axis of the tube and the second surface disposed at a second radial distance from the central axis of the tube, the first radial distance different from the second radial distance.

15. The gradient coil assembly of claim 1, wherein the first plurality of electrically conductive paths comprise a plurality of inter-wound spirals, each of the plurality of electrically conductive paths adjacent at least one other of the plurality of electrically conductive paths.

16. A gradient coil assembly, comprising:
   an insulator sheet formed into a tube extending along an axis;
   a first electrically conductive sheet bonded to a first surface of the insulator sheet including a first plurality of electrically conductive paths, each of the first plurality of electrically conductive paths initiating at a first common region and terminating at a second common region on the first electrically conductive sheet, the second common region being distant from the first common region; and a second electrically conductive sheet bonded to a second surface of the insulator sheet including a second plurality of electrically conductive paths, wherein each of the second plurality of electrically conductive paths is electrically coupled with a corresponding one of the first plurality of electrically conductive paths, wherein the first and second plurality of electrically conductive paths are defined by first ends and opposite second ends, the first ends of each of the first plurality of electrically conductive paths mating with respective first ends of the second plurality of electrically conductive paths through the insulator sheet, the seconds ends of each being operably coupled to one of a power source and another gradient coil assembly.

17. The gradient coil assembly of claim 16, wherein the first ends mate in a central portion defining each of the first and second electrically conductive sheets.

18. The gradient coil assembly of claim 16, wherein the first ends of the first electrically conductive paths are transposed when mating with respective first ends of the second electrically conductive paths.

19. The gradient coil assembly of claim 16, wherein the first and second electrically conductive sheets are each copper plates having the first and second plurality of conductive paths being spiral cuts in each respective copper plate.

20. The gradient coil assembly of claim 19, wherein the spiral cuts are defined by the first and second ends, the first ends having mating tabs for electrical connection between the copper plates.

21. The gradient coil assembly of claim 19, wherein each of the copper plates include a thickness of about 1 mm.

22. The gradient coil assembly of claim 19, wherein a direction of the spiral cuts on each copper plate allows an electrical current to spiral inward from an edge defining one copper plate producing a first gradient field, through the insulator sheet, and spiral outward on the other copper plate producing a second gradient field which adds to the first gradient field on the one copper plate.

23. The gradient coil assembly of claim 19, wherein each of the first and second plurality of electrically conductive paths is substantially electrically equal achieving equal current sharing therebetween.

24. The gradient coil assembly of claim 23, wherein a configuration of the spiral cuts is determined by software configured to determine a number of turns to provide a suitable gradient strength, gradient linearity and current and voltage match relative to a given power supply.

25. The gradient coil assembly of claim 19, wherein the spiral cuts on each plate are identical.

26. A method for assembling a gradient coil assembly configured for use in an MRI device, comprising:
disposing a first electrically conductive sheet generally concentrically about a second electrically conductive sheet with an insulator sheet therebetween;
forming a first plurality of electrically conductive paths on the first electrically conductive sheet, each of the first plurality of electrically conductive paths initiating at a first common region and terminating at a second common region on the first electrically conductive sheet, the second common region being distant from the first common region;
forming a second plurality of electrically conductive paths on the second electrically conductive sheet; and
electrically coupling each of the second plurality of electrically conductive paths with a corresponding one of the first plurality of electrically conductive paths;
wherein the second plurality of electrically conductive paths are disposed concentrically relative to the first plurality of electrically conductive paths; and
wherein the first and second electrically conductive paths are defined by first ends and opposite second ends, the first ends of each of the first plurality of electrically conductive paths mating with respective first ends of the second plurality of electrically conductive paths through the insulator sheet at central portion defining each of the first and second electrically conductive sheets, the second ends of each being operably coupled to one of a power source and another gradient coil assembly.

27. The method of claim 26 further comprising:
bonding the first and second electrically conductive sheets to respective first and second surfaces of the insulator sheet with an adhesive.

28. The method of claim 26 further comprising: transposing the first ends of the first plurality of electrically conductive paths when mating with respective first ends of the second plurality of electrically conductive paths.

29. The method of claim 26, wherein the first and second plurality of electrically conductive sheets are each copper plates having the first and second plurality of conductive paths being spiral cuts in each respective copper plate.

30. The method of claim 29, wherein the spiral cuts are defined by the first and second ends, the first ends having mating tabs for electrical connection between the copper plates.

31. The method of claim 29, wherein each of the copper plates each include a thickness of about 1 mm.

32. The method of claim 29, wherein a direction of the spiral cuts on each copper plate allows an electrical current to spiral inward from an edge defining one copper plate producing a first gradient field, through the insulator sheet, and spiral outward on the other copper plate producing a second gradient field which adds to the first gradient field on the one copper plate.

33. The method of claim 29, wherein each of the first and second plurality of electrically conductive paths is substantially electrically equal achieving equal current sharing therebetween.

34. The method of claim 33 further comprising:
determining a configuration of the spiral cuts using software configured to determine a number of turns to provide a suitable gradient strength, gradient linearity and current and voltage match relative to a given power supply.

35. The method of claim 29, wherein the spiral cuts are identical on each plate.

* * * * *